United States Patent
Huisman et al.

(10) Patent No.: US 7,240,261 B2
(45) Date of Patent: Jul. 3, 2007

(54) SCAN CHAIN DIAGNOSTICS USING LOGIC PATHS

(75) Inventors: Leendert M. Huisman, South Burlington, VT (US); Leah M. Pastel, Essex, VT (US)

(73) Assignee: International Business Machines Corporation, Armonk, NY (US)

( * ) Notice: Subject to any disclaimer, the term of this patent is extended or adjusted under 35 U.S.C. 154(b) by 468 days.

(21) Appl. No.: 10/707,373

(22) Filed: Dec. 9, 2003

(65) Prior Publication Data
US 2005/0138508 A1 Jun. 23, 2005

(51) Int. Cl.
*G01R 31/28* (2006.01)
*G06F 17/50* (2006.01)

(52) U.S. Cl. .......................... 714/726; 716/4
(58) Field of Classification Search ................ 714/718, 714/724, 726, 727, 729, 732, 734, 742
See application file for complete search history.

(56) References Cited

U.S. PATENT DOCUMENTS

| | | | |
|---|---|---|---|
| 4,630,270 A * | 12/1986 | Petit et al. ..................... 714/45 |
| 5,598,421 A * | 1/1997 | Tran et al. .................. 714/726 |
| 5,663,967 A * | 9/1997 | Lindberg et al. ............ 714/737 |
| 6,016,564 A * | 1/2000 | Hosokawa .................. 714/726 |
| 6,278,956 B1 * | 8/2001 | Leroux et al. .............. 702/117 |
| 6,308,290 B1 | 10/2001 | Forlenza et al. ............ 714/724 |
| 6,442,720 B1 * | 8/2002 | Koprowski et al. ......... 714/726 |
| 6,553,524 B1 * | 4/2003 | Das ............................. 714/726 |
| 6,694,454 B1 * | 2/2004 | Stanley ........................ 714/30 |
| 2002/0188903 A1 * | 12/2002 | Chu et al. .................... 714/738 |
| 2003/0131294 A1 * | 7/2003 | Motika et al. ............... 714/718 |

FOREIGN PATENT DOCUMENTS
EP   1130410 A2 *   9/2006

OTHER PUBLICATIONS

"Diagnosing Scan Chain Faults" by Kundu, S. This paper appears in: IEEE Transactions on Very Large Scale Integration (VLSI) Systems, Publication Date: Dec. 1994 vol. 2, Issue: 4 On pp. 512-516 ISSN: 1063-8210 INSPEC Accession No. 4839256.*
"Scan Chain Diagnosis Using IDDQ Current Measurement" by Hirase et al. This paper appears in: Eighth Asian Test Symposium, 1999. (ATS '99) Proceedings. Publication Date: 1999 On pp. 153-157 ISBN: 0-7695-0315-2 INSPEC Accession No. 6544163.*
Schafer et al., Partner SRLS for Improved Shift Register Diagnostics, IEEE VLSI Test Symposium 1992, pp. 198-201.

* cited by examiner

*Primary Examiner*—Cynthia Britt
(74) *Attorney, Agent, or Firm*—Schmeiser, Olsen & Watts; Michael LeStrange

(57) ABSTRACT

A structure and method for performing scan chain diagnosis. The structure comprises a diagnosed/target scan chain and one or more good observation scan chains. Observing logic paths from the target scan chain to observation scan chains can be identified according to a pre-specified criterion. The diagnosed scan chain is loaded in series with a test pattern. Then, the contents of the observed latch(es) in the diagnosed scan chain propagate through the observing logic paths. Then, the output signals of the observing logic paths are strobed into the observing latch(es) in the observing scan chain(s). Then, the observing scan chain(s) are unloaded and the contents of the observing latch(es) are collected and analyzed to determine the defect types and the defect ranges in the diagnosed scan chain.

15 Claims, 5 Drawing Sheets

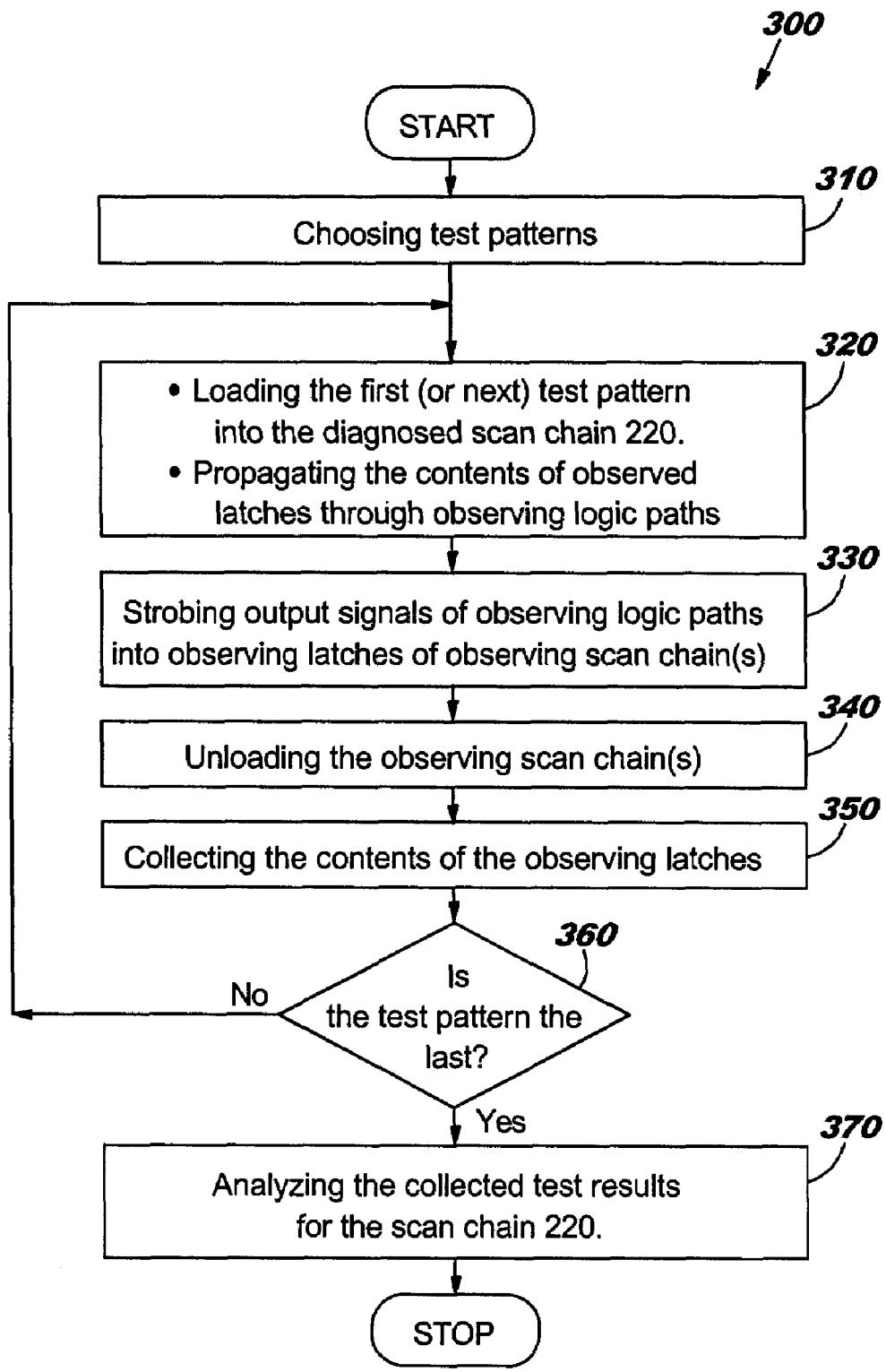

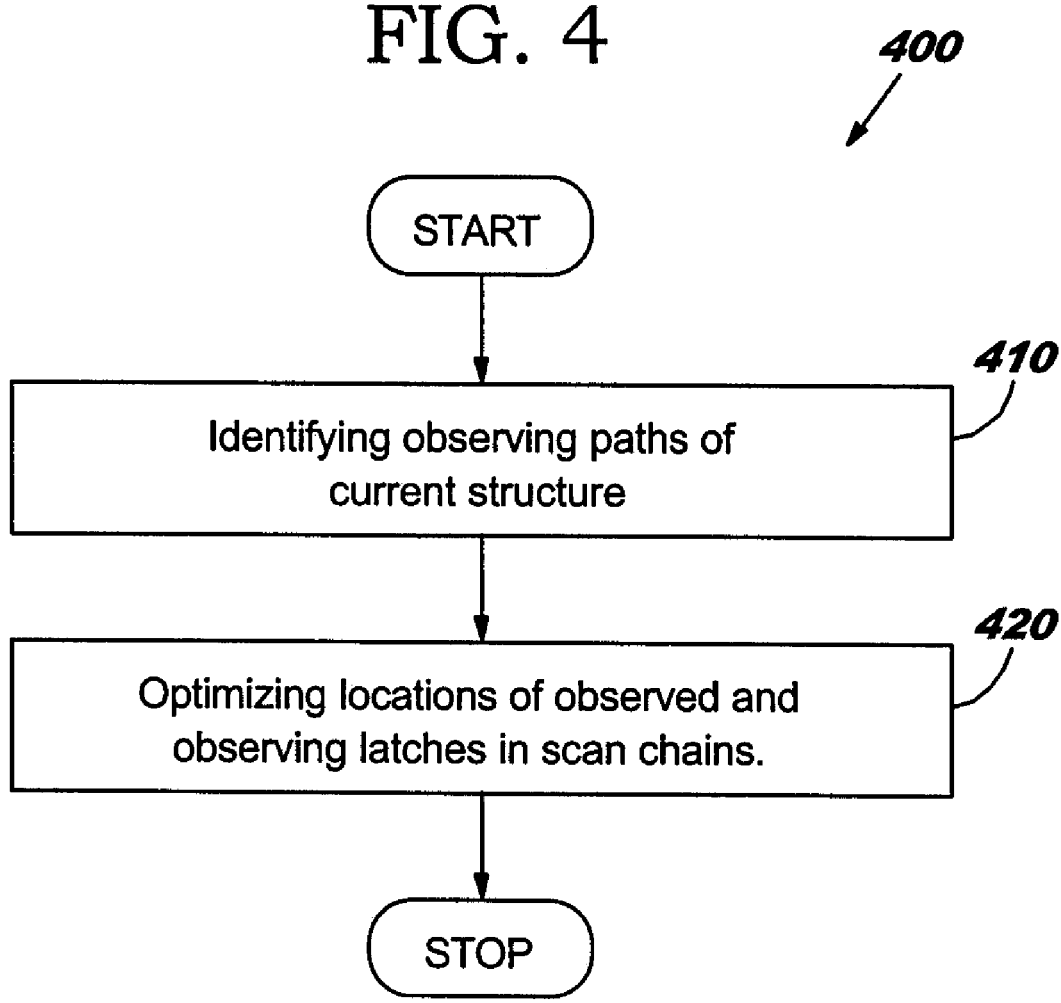

SCAN CHAIN DIAGNOSTICS USING LOGIC PATHS

BACKGROUND OF INVENTION

1. Technical Field

The present invention relates to scan chain diagnosis, and more specifically, to methods and structures for diagnosing fails in scan chains.

2. Related Art

Typically, scan chains are instantiated in an integrated circuit (IC) design to provide better controllability and observability of functional logic for structural test and design debug. During IC test, the scan chains themselves are tested to assure that they function properly; and thus, testing is valid.

Scan chain diagnostics is important in determining the root cause of scan chain failure. The prior art contains many schemes to design-in scan chain diagnosability by adding circuitry and wiring to an IC design, costing area and design complexity. Scan chain diagnostics requires extensive tester characterization, large volumes of diagnostic test data to be collected, or use of physical fault isolation techniques, such as photon emission microscopy.

Reduced scan chain yield can impact IC manufacturing yields. As a result, methods that facilitate scan chain diagnostic test, data collection, and diagnostics are important components in yield learning and maintenance, as well as, design and test debug. Also, designs of scan chains that facilitate those methods are needed.

SUMMARY OF INVENTION

The present invention provides a method for diagnosing failing scan chains, the method comprising the steps of (a) identifying logic paths from a target scan chain to at least one observation scan chain until a pre-specified selection criterion is achieved; (b) activating the identified logic paths so as to capture the contents of associated target latches in the target scan chain into observation latches in at least one observation scan chain; and (c) analyzing the contents of the observation latches to determine defect ranges in the target scan chain.

The present invention further provides a method of constructing scan chains to enable diagnosing failing scan chains, the method comprising the steps of (a) identifying simple logic paths from first target latches in a target scan chain to at least one other observation scan chain; and (b) optimizing the locations of the first target latches in the target scan chain.

The present invention also provides a method of constructing scan chains to enable diagnosing failing scan chains, the method comprising the steps of (a) identifying logic paths from target latches in a target scan chain to observation latches in at least one other observation scan chain; and (b) optimizing the locations of the observation latches within the other scan chains.

The present invention also provides a method for diagnosing failing scan chains, the method comprising the steps of (a) identifying at least one target latch in a target scan chain; (b) identifying at least one logic path electrically coupled to the at least one target latch; and (c) identifying at least one observation latch electrically coupled to the at least one logic path.

The present invention provides structures that facilitate scan chain diagnostic test, data collection, and diagnostics are important components in yield learning and maintenance, as well as, design and test debug.

The present invention also provides methods for testing such structures.

BRIEF DESCRIPTION OF DRAWINGS

FIG. 3 illustrates the flow chart of a method for performing diagnostic testing and data collection on the middle scan chain of FIG. 2A.

FIG. 4 illustrates the flow chart of a method for improving scan chain designs for the structure 100 of FIG. 1.

DETAILED DESCRIPTION

Figure 1:
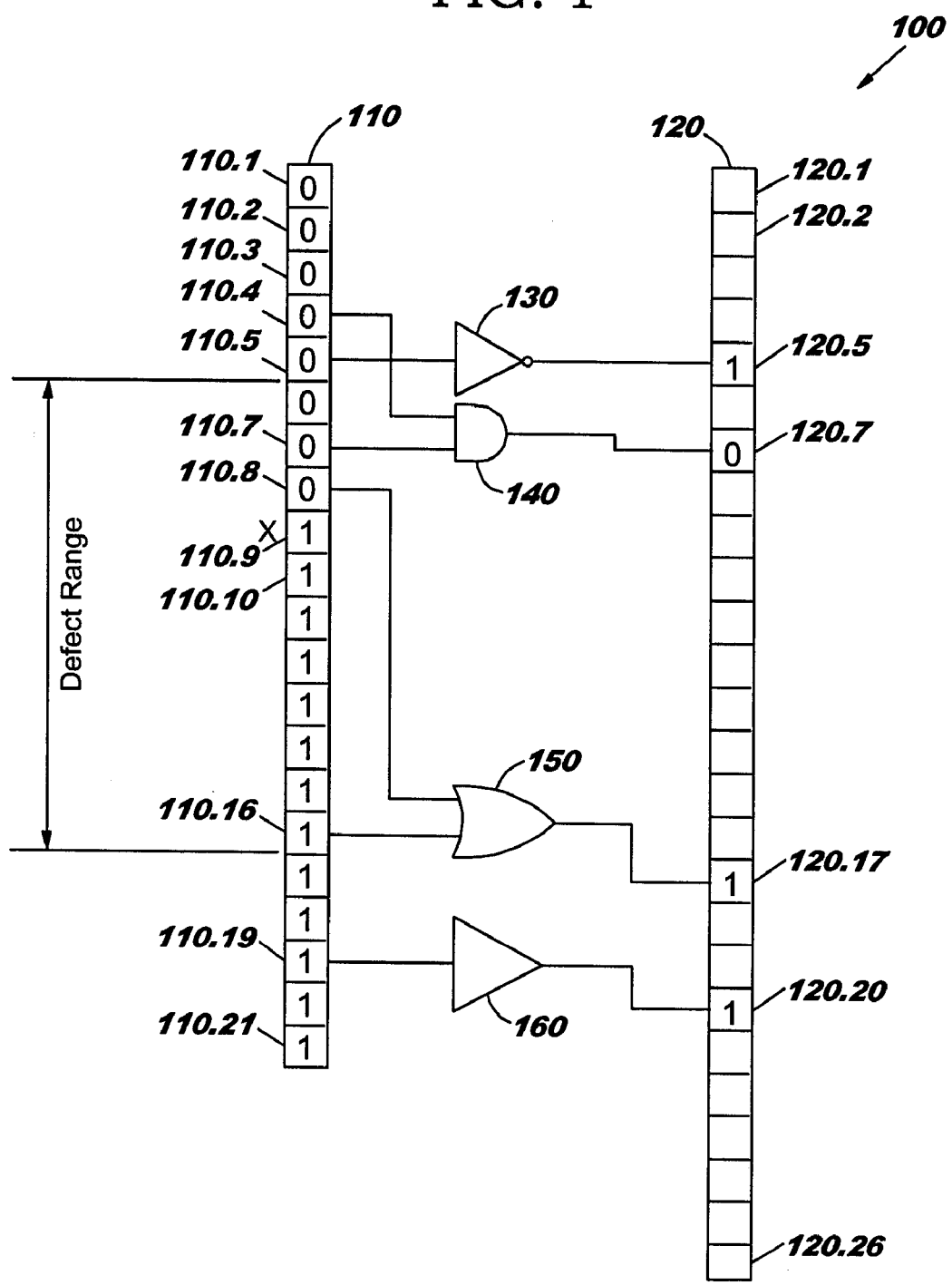
FIG. 1 illustrates a digital structure comprising two scan chains coupled together via logic, in accordance with embodiments of the present invention.

FIG. 1 illustrates a digital structure 100 comprising two scan chains 110 and 120 coupled together via logic, in accordance with embodiments of the present invention. The scan chain 110 comprises, illustratively, latches 110.1, 110.2, . . . , and 110.21, in series. The scan chain 120 comprises, illustratively, latches 120.1, 120.2, . . . , and 120.26 in series.

The structure 100 also comprises, illustratively, an inverter 130, an AND gate 140, an OR gate 150, and a buffer 160. Illustratively, the inverter 130 receives the content of the latch 110.5 as an input signal, and generates an output signal to the latch 120.5. The AND gate 140 receives the contents of the latches 110.4 and 110.7 as input signals and generates an output signal to the latch 120.7. The OR gate 150 receives the contents of the latches 110.8 and 110.16 as input signals and generates an output signal to the latch 120.17. The buffer 160 receives the content of the latch 110.19 as an input signal and generates an output signal to the latch 120.20.

As an example of a method for performing diagnostic testing and data collection on the scan chain 110 in accordance with embodiments of the present invention, assume that the scan chain 110 has only one defect, and the only defect is a stuck-at-1 defect at the latch 110.9, marked by an X. In other words, the latch 110.9 stores a 1(referred to as the stuck-at-value) regardless of the value loaded to it from the latch 110.8.

In one embodiment of the present invention, a string of the opposite of the stuck-at-value (i.e., a string of 0s) longer than the scan chain 110 (i.e., more than twenty-one 0s) is loaded in series into the scan chain 110 via the latch 110.1. The 0s propagate down the scan chain 110 and reach the defective latch 110.9. From the latch 110.9 on, the string of 0s becomes a string of 1s (the stuck-at-value). Eventually, for the scan chain 110, all the latches above the stuck-at-1 latch 110.9 (i.e., the latches 110.1–110.8) store a 0, and all the latches from the latch 110.9 down (i.e., the latches 110.9–110.21) store a 1.

In one embodiment, after the scan chains 110 is loaded with the string of 0s via the latch 110.1, the four output signals from the inverter 130, the AND gate 140, the OR gate 150, and the buffer 160 are strobed into the latches 120.5, 120.7, 120.17, and 120.20, respectively. As a result, after strobing, the latches 120.5, 120.7, 120.17, and 120.20 of the scan chain 120 store a 1, 0, 1, and 1, respectively.

Assume further that the scan chain 120 is functional (i.e., has no defect). The scan chain 120 is unloaded in series via the latch 120.26 and the contents of the latches 120.5, 120.7, 120.17, and 120.20 are examined. From the contents of the latches 120.5, 120.7, 120.17, and 120.20, the defective latch can be determined to be between the latches 110.6 and 110.16, inclusively.

More specifically, the defective latch could not be between the latches 110.1 and 110.5, inclusively. Else, the latch 120.5 would have received a 0 from the inverter 130. The defect latch could not be between the latches 110.17 and 110.21, inclusively. Else, the latch 120.17 would have received a 0 from the OR gate 150. As a result, the defective latch must be between the latches 110.6 and 110.16, inclusively.

The contents of the observing latches 120.5, 120.8, 120.17, and 120.20 are determined by the contents of the observed latches 110.4, 110.5, 110.7, 110.8, 110.16, and 110.19 after strobing. More specifically, after strobing, the content of the observing latch 120.5 is determined by the content of the latch 110.5. The content of the observing latch 120.7 is determined by the contents of the latches 110.4 and 110.7. The content of the observing latch 120.17 is determined by the contents of the latches 110.8 and 110.16. The content of the observing latch 120.20 is determined by the content of the latch 110.19.

In other words, the latches 110.4, 110.5, 110.7, 110.8, 110.16, and 110.19 of the bad scan chain 110 are observed from the good scan chain 120 via the observing latches 120.5, 120.7, 120.17, and 120.20.

In short, given that the diagnosed scan chain 110 has only one defective latch and that the defective latch is stuck-at-1, the defective latch can be determined to be between the latches 110.6 and 110.16, inclusively, by examining the contents of the observing latches 120.5, 120.7, 120.17, and 120.20 of the observing scan chain 120 after strobing.

Figure 2A:
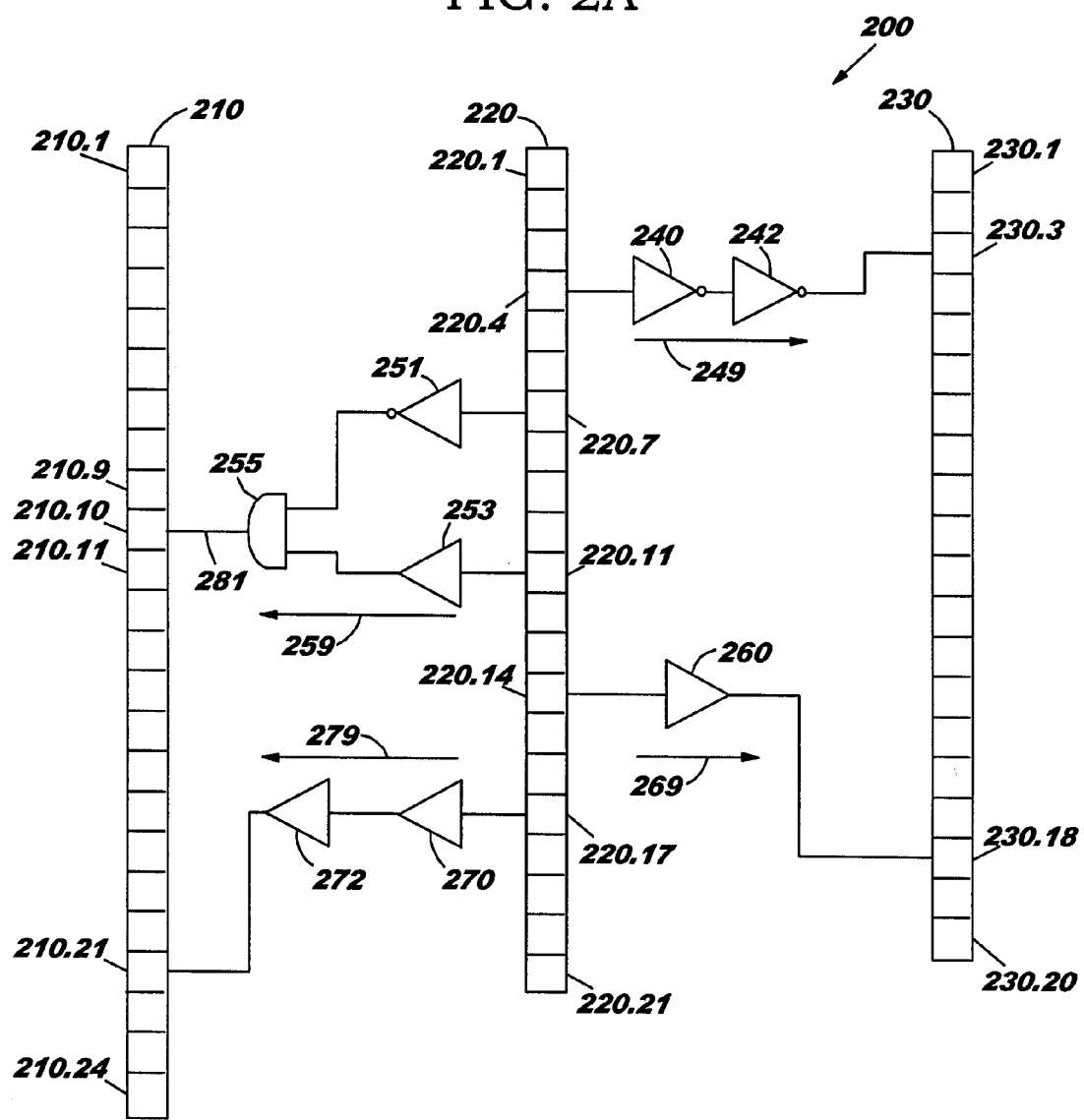
FIG. 2A illustrates a digital structure comprising three scan chains wherein some latches of the middle scan chain can be observed from the other two scan chains, in accordance with embodiments of the present invention.

FIG. 2A illustrates a digital structure 200 comprising three scan chains wherein some latches of the middle scan chain can be observed from the other two scan chains, in accordance with embodiments of the present invention. Illustratively, the structure 200 comprises scan chains 210, 220, and 230. The scan chain 210 comprises, illustratively, latches 210.1, 210.2, . . . , and 210.24 in series. The scan chain 220 comprises, illustratively, latches 220.1, 220.2, . . . , and 220.21 in series. The scan chain 230 comprises, illustratively, latches 230.1, 230.2, . . . , and 230.20 in series.

The structure 200 also comprises, illustratively, inverters 240, 242, and 251, buffers 253, 260, 270, and 272, and an AND gate 255. The inverters 240 and 242 in series electrically couple the observed latch 220.4 of the scan chain 220 to the observing latch 230.3 of the scan chain 230. In other words, the inverters 240 and 242 form an observing logic path 249 from the observed latch 220.4 to the observing latch 230.3. Similarly, the inverter 251, the buffer 253, and the AND gate 255 form another observing logic path 259 from the observed latches 220.7 and 220.11 to the observing latch 210.10 via connection 281. The buffer 260 forms yet another observing logic path 269 from the observed latch 220.14 to the observing latch 230.18. Finally, the buffers 270 and 272 in series form yet another observing logic path 279 from the observed latch 220.17 to the observing latch 210.21.

As a result, the contents of the observed latches 220.4, 220.7, 220.11, 220.14, and 220.17 of the scan chain 220 can be indirectly observed from the observing latches 210.10 and 210.21 of the scan chain 210 and from the observing latches 230.3 and 230.18 of the scan chain 230.

Figure 2B:
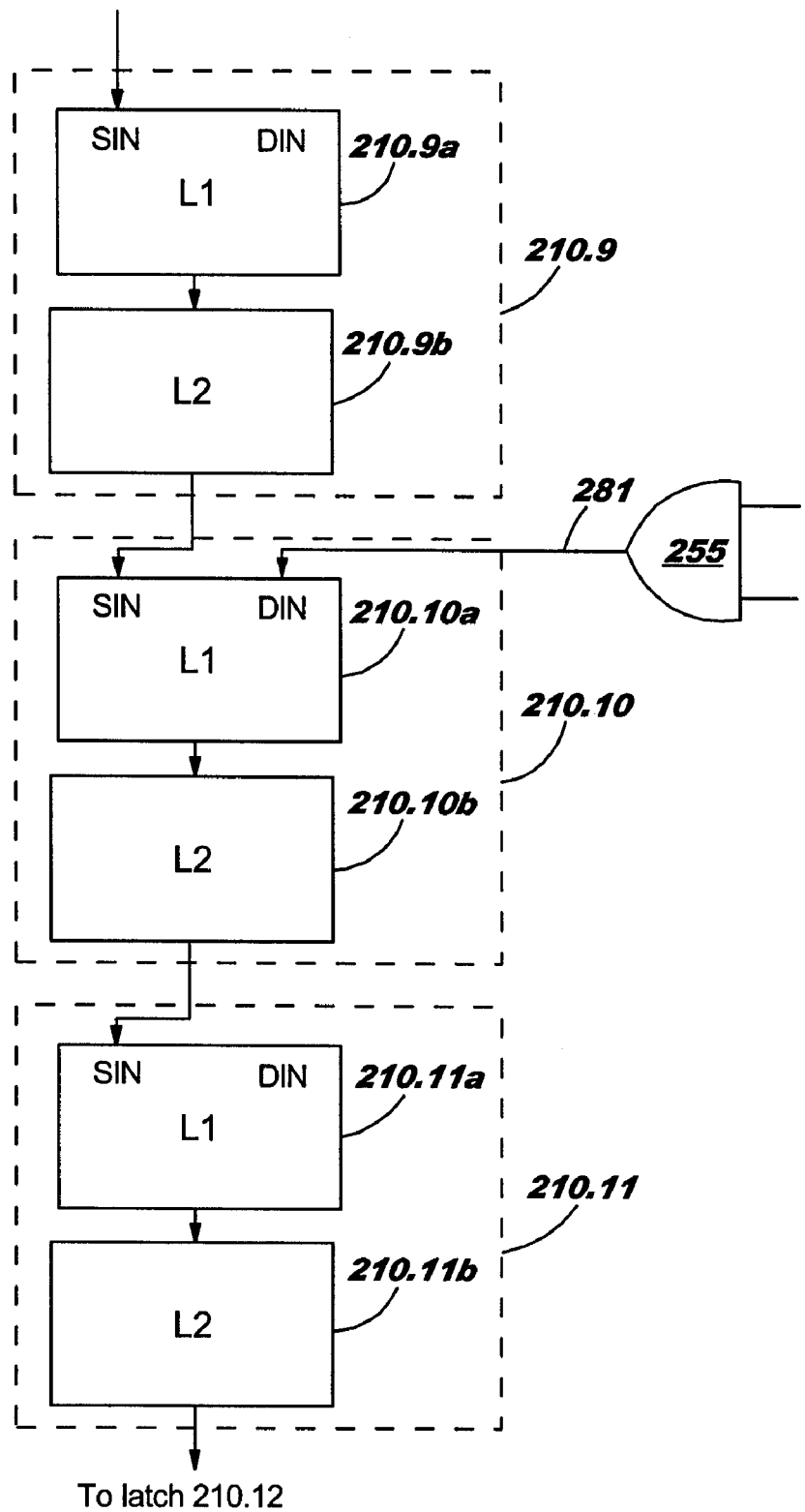
FIG. 2B illustrates some latches of FIG. 2A, in accordance with embodiments of the present invention.

FIG. 2B illustrates the latches 210.9, 210.10, and 210.11 of FIG. 2A, in accordance with embodiments of the present invention. Illustratively, the latch 210.10 comprises L1 latch 210.10a and L2 latch 210.10b in series. Similarly, the latch 210.9 comprises L1 latch 210.9a and L2 latch 210.9b in series, and the latch 210.11 comprises L1 latch 210.11a and L2 latch 210.11b in series.

In the observing latch 210.10, the L1 latch 210.10a has two input ports: scan-in input port SIN and functional data input port DIN. The SIN port of the L1 latch 210.10a receives an input signal from the L2 latch 210.9b. The DIN port of the L1 latch 210.10a receives another input signal from the AND gate 255 via connection 281. The L1 latch 210.10a generates an output signal to the L2 latch 210.10b, which in turn generates an output signal to the SIN port of the L1 latch 210.11a.

The L1 and L2 latches of the latches 210.9 and 210.11 have similar electrical connections. Their DIN ports may be electrically connected to the chip logic; however, the latches 210.9 and 210.11 have not been identified as observing latches. In one embodiment, the other observing latches in the structures 100 and 200 (FIGS. 1 and 2A) have a structure similar to that of the observing latch 210.10. The other non-observing latches in the structures 100 and 200 have a structure similar to that of the non-observing latch 210.9. In one embodiment, each latch 210.i (i=1–24) receives scan-in data via its SIN port.

In one embodiment, the structures 100 and 200 (FIGS. 1 and 2A) are designed such that all the scan chains 210, 220, and 230 are loaded at the same time. When the broken chain (scan chain 220) is loaded to activate the fail, the good chains (scan chains 210 and 230) are loaded with states opposite to the values they are expected to observe.

FIG. 3 illustrates the flow chart of a method 300 for performing diagnostic testing and data collection on the scan chain 220 of FIG. 2A. In one embodiment, diagnostic testing for the scan chain 220 of the structure 200 starts at step 310 in which test patterns are chosen. Each of the chosen test patterns is used for diagnosing a possible defect in the scan chain 220. For instance, a test pattern of all 0s (i.e., a string of all 0s) can be used to diagnose the scan chain 220 for any possible stuck-at-1 defect. This is illustrated in the example described above with respect to FIG. 1. Similarly, another test pattern of all 1s can be used to diagnose the scan chain 220 for any possible stuck-at-0 defect.

In step 320, a first test pattern of the chosen test patterns is loaded in series into the scan chain 220 via the latch 220.1. The contents of the observed latches 220.4, 220.7, 220.11, 220.14, and 220.17 of the scan chain 220 propagate through the observing logic paths 249, 259, 269, and 279. Then, in step 330, the output signals of the observing logic paths 249, 259, 269, and 279 are strobed into the observing latches 210.10, 210.21, 230.3 and 230.18 of the observing scan chains 210 and 230. Then, in step 340, the observing scan chains 210 and 230 are unloaded via the latches 210.24 and 230.20, respectively, and in step 350, the contents of the observing latches 210.10, 210.21, 230.3 and 230.18 (i.e., the test results) are collected.

Next, in step 360, a determination is made as to whether the currently run test pattern (here, the first test pattern) is the last one of the chosen test patterns. If the answer is negative, step 320 is performed for the next test pattern, and so on. If the answer to the question in step 360 is affirmative, then in step 370, all collected test results are analyzed so as to determine the possible types of defects (if any) and to narrow down the defect ranges.

In short, the chosen test patterns are run for the scan chain 220 and the contents of the observing latches 210.10, 210.21, 230.3 and 230.18 of the observing scan chains 210 and 230 are analyzed so as to determine the possible types of defects and also narrow down the defect ranges.

In one embodiment, a number of circuits (not shown) each containing the structure 200 are diagnosed for defects in the scan chain 220 using the method 300. More specifically, in step 310, test patterns are chosen for all the circuits. Then, for each one of the circuits, the chosen test patterns are run and test results are collected (steps 320, 330, 340, 350, and 360). However, step 370 is not performed immediately after the test results for that circuit are collected. Instead, only when all test results have been collected for all circuits, the collected test results are analyzed in step 370.

In summary, when diagnosing a scan chain (like the scan chains 110 and 220 in FIGS. 1 and 2, respectively), test patterns are loaded into the diagnosed scan chain and the contents of the scan chain"s observed latches are propagated through the observing logic paths towards other good, observing scan chain(s). Then, the output signals of the observing logic paths are strobed into the observing latches of the other good, observing scan chain(s). The contents of the observing latches, collected from the unload of the other good, observing scan chain(s), are analyzed to determine the defect types (if any) and to narrow down the defect ranges in the diagnosed scan chain. The analysis results help identify errors during the fabrication process.

FIG. 4 illustrates the flow chart of a method 400 for improving scan chain designs for the structure 100 and FIG. 1. The method 400 starts with step 410 in which the structure 100 is examined to identify the currently observing logic paths. As a result of step 410, the four paths going through the four gates 130, 140, 150, and 160 are identified. Also, the observed latches 110.4, 110.5, 110.7, 110.8, 110.16, and 110.19 of the scan chain 100 are identified. Also, the observing latches 120.5, 120.7, 120.17, and 120.20 are identified. In step 420, the locations of the observed and observing latches in the structure 100 are optimized. In one embodiment, in step 420, optimization means that the largest distance in terms of latches between two adjacent observed latches is minimized while keeping the number of observed latches unchanged.

For instance, in FIG. 1, the shortest distance in terms of latches between two adjacent observed latches is 1 latch, which is the distance between two adjacent observed latches 110.4 and 110.5, and also between two adjacent observed latches 110.7 and 110.8. This can be improved by choosing to observe the latches 110.10 and 110.13 instead of the latches 110.5 and 110.8. As a result, in the new design, the observed latches are 110.4, 110.7, 110.10, 110.13, 110.16, and 110.19. Now, the shortest distance in terms of latches between two adjacent observed latches is 3 latches. As a result, other observing logic paths must be chosen for the new observed latches 110.10 and 110.13, and new observing latches in scan chain 120 may also be chosen.

In one embodiment, in step 420, the list of the observed latches in the scan chain 110 (i.e., 110.4, 110.5, 110.7, 110.8, 110.16, and 110.19) is kept unchanged, but the order of the latches (whether observed or not) in the scan chain 110 is changed so as to optimize the locations of the observed latches.

For instance, the order of the latches in the scan chain 110 can be re-ordered as follows: 100.1, 100.2, 100.3, 100.4, 100.6, 100.9, 100.5, 100.10, 100.11, 100.7, 100.12, 100.13, 100.8, 100.14, 100.15, 100.16, 100.17, 100.18, 100.19, 100.20, and 100.21. Here, the largest distance in terms of latches between two adjacent observed latches is 3 latches, which is also the optimum value. The observing logic paths and the observing latches in the scan chain 120 are unchanged.

In one embodiment, the number of the observed latches in the scan chain 110 is changed, and the locations of the observed latches are optimized. In another embodiment, new latches are added to scan chain 110.

In one embodiment, the resulting structure of the new design is tested using the method 300 of FIG. 3. Because, the observed latches have been chosen to be located in optimum locations, diagnosis of scan chain fails are made much easier, and the defect ranges can be identified with higher accuracy.

In the embodiments described above, the good, observing scan chains 120, 210, and 230 could be loaded in an operation separate from loading the broken scan chains 110 and 220. In an alternative embodiment, the observing scan chains 120, 210, and 230 are loaded with a string of the stuck-at-value at the same time as the observed scan chains 110 and 220 are loaded with a test pattern. For instance, with reference to FIG. 1, when the observed scan chain 110 is loaded with the string of 0s to diagnose it for a stuck-at-1 defect, the observing scan chain 120 is loaded with a string of 1s.

In the embodiments described above, the scan chains 110, 120, 210, 220, and 230 have specific numbers of latches. In general, each of the scan chains can have any number of latches.

In the embodiments described above, a diagnosed scan chain can be observed from another scan chain (FIG. 1) or from two other scan chains (FIG. 2A). In general, a scan chain can be observed from any number of other scan chains. Moreover, it is in accordance with embodiments of the present invention to have a structure in which a first scan chain is observed from a second scan chain, and the second scan chain is observed from the first scan chain.

The present invention provides methods for obtaining information as to location (ranges) of the failing elements on the failing chip. In general, the number of observing logic paths between scan chains is limited only by practical limitations. The more observing logic paths between scan chains, the finer the granularity in isolating the failing elements on the chip.

The observing logic paths can be simple with a few simple logic gates (AND, OR, or inverter). The observing logic paths can be complex with many logic gates. The observing logic paths can be selected from existing chip logic, or can be added for the express purpose of performing the scan chain diagnosis.

In one embodiment, a scan chain can comprise multiple segments wherein a latch in one segment of the scan chain can be observed from another latch in another segment of the same scan chain.

In summary, the present invention is a scan chain diagnostic method that uses the functional logic paths within the IC design to provide observability of latches within failing scan chains. This method also allows for low volume diagnostic data collection, suitable for manufacturing test. The steps for the invented method of scan diagnostics can be summarized as follows: Step 1: Analyzing the IC design for specific logic paths that can be used to observe the state of a possibly failing latch (target latch), located in one scan chain, in a latch of another scan chain (observation latch).

Step 2: Applying test patterns that condition the failing scan chain with failing states, activating the logic path(s) identified in step 1, capturing the target latch states in observation latches, and measuring observation latches.

Step 3: Comparing the observation latch"s measured data with its expected data, and determining whether target latches pass or fail. This data is then analyzed to determine the latch or range of latches where the scan chain is defective.

The definition of logic paths for observation of failing scan chain latches is IC design specific. In one embodiment of the invention, the IC design can be analyzed once in preparation to diagnose scan fails. In another embodiment, the IC design could be analyzed for each failing device diagnosed, based on an approximation of where the scan chain is defective derived from another scan diagnostic technique. Only paths associated with the suspected latch range would need to analyzed.

A correspondence between target latch, target latch state, observation latch and observation latch expected state is constructed, based on chosen observation paths. In accordance with an embodiment of the invention, the correspondence could be compiled into a look up table (LUT).

The selection and number of logic paths included in the correspondence can be specified by the user, and will generally depend on the IC design, test pattern complexity, and end use of the diagnostic information. Logic paths, for example, may be selected based on target latch granularity and pattern creation complexity. Different paths may be used to observe different states in the same target latch.

In one embodiment, step 1 above comprises: Step 1A: Identifying simple logic paths between target and observation latches, such as paths containing buffers or inverters; then selecting the paths; and adding the selected paths to correspondence, until user selection criterion is satisfied. Simple logic paths can be defined as paths that do not have any side inputs. For instance, in FIG. 2, the path 249 is a simple path because it has only one input from the latch 220.4 (i.e., no side or other inputs). Similarly, the paths 269 and 279 are two other simple paths. If simple logic paths are exhausted before user selection criterion is satisfied, step 1B is performed.

Step 1B: Identifying complex logic paths, such as paths containing 2-way AND or OR circuits; selecting the identified paths; and adding the selected paths to correspondence, until user selection criterion is satisfied. Complex logic paths can be defined as paths that have side input(s). For instance, in FIG. 2, the path 259 is a complex path because it has two inputs coming from latches 220.7 and 220.11.

In the steps 1A, 1B, and 1C described above, the logic paths are selected one after another in an increasing degree of logic path complexity.

In one embodiment, the user selection criterion can be pre-specified as the maximum value for the largest distance (in terms of latches) between two adjacent target latches in the target scan chain. For example, if the pre-specified maximum value is 5, the steps above need to be performed to identify logic paths until there are sufficient target (observed) latches in the target (observed) scan chain such that the largest distance (in terms of latches) between two adjacent target latches in the target scan chain is no more than 5.

The present invention also provides a method for optimizing scan chain latch content and organization for use with the described diagnostic method. This method makes use of functional latches and paths to improve diagnostics, within the limitation of the IC design. The present invention also provides for the addition of paths and latches specifically for improving diagnostics.

In one embodiment of the invention, the area and wiring impacts are mitigated by adding a user defined number of logic paths between latches and adding latch circuits in specific scan chain locations. In one embodiment, steps for optimizing scan chain definition in an iterative process are given below: Step A: Identifying simple logic paths (defined above) between target and observation latches, such as paths containing buffers or inverters, then identifying corresponding target observation latch pairs.

Step B: Optimizing the locations of target observation latches identified in step A within the scan chains. Either or both latches may be assigned a different location (i.e., reordering) within their original scan chain or moved to another scan chain within limitation posed by the IC design and design methodology.

Step C: Identifying complex logic paths (defined above) paths, such as paths containing 2-way AND or OR circuits, then identifying corresponding target observation latch pairs.

Step D: Optimizing the locations of target observation latches identified in steps A and C within the scan chains.

Step E: Adding additional latch pairs where more target latch granularity is desired. Each latch in the pair is connected to the other by a buffered logic path; thus, each latch is a target latch observed by the other latch in the pair.

In one embodiment, a target latch in a target scan chain can be moved to another scan chain to increase the observability of that other scan chain.

In one embodiment, the target latch to observation latch LUT may be constructed prior to final physical placement. Locations for all target latches in the LUT are optimized.

In another embodiment of the invention, the latches supplying conditioning inputs to selected combinatorial logic paths are located in a scan chain other than the scan chain containing the target latch to facilitate diagnostics and pattern generation.

In one embodiment, the locations of the observation latches in the other scan chains can be reordered such that the observation latches are located close to the scanout of the scan chain. This improves the chances that the observation latches will be unloaded with valid states, even if the observation chain is broken. It also may reduce test time and data collection, by allowing complete fail data acquisition with a partial unload of the chains.

In one embodiment, user selection criterion described in previous embodiment may mean a prespecified number of logic paths from the target scan chain. For example, a user may specify that N (N being a positive integer) observation logic paths need to be identified. Then, the process of identifying observation logic paths stops when N observation logic paths have been identified.

In embodiment of the present invention, low volume diagnostic data collection, suitable for manufacturing test, is enabled.

In one embodiment of the present invention, with reference to FIG. 2A, at least a new target latch (not shown) can be added into the target scan chain 220. Also, a new logic path can be added to connect the added target latch to an existing observation latch in another scan chain 210 or 230.

Alternatively, an existing latch in the target latch 220 can be identified as a target latch; and a new observation latch (not shown) can be added into another scan chain 210 or 230; and a new logic path can be added connecting from the target latch to the added observation latch.

Alternatively, at least a new target latch (not shown) can be added into the target scan chain 220. Also a new observation latch (not shown) can be added into another scan chain 210 or 230; and a new logic path can be added connecting from the added target latch to the added observation latch.

In one embodiment, at least one of the target latches in the target scan chain 220 can be moved to another scan chain 210 or 230.

In one embodiment, one or more latches in the scan chain 220 are chosen/identified as target latch. Then, logic paths electrically coupled to the target latch is identified. Finally, observation latches electrically coupled to the identified logic paths are identified.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A method for diagnosing failing scan chains, the method comprising the steps of:
   identifying logic paths from a target scan chain to at least one observation scan chain until a pre-specified selection criterion is achieved;
   activating the identified logic paths so as to capture the contents of associated target latches in the target scan chain into observation latches in at least one observation scan chain; and
   analyzing the contents of the observation latches to determine defect ranges in the target scan chain.

2. The method of claim 1, wherein at least one latch of the target scan chain is not observed from any other scan chain.

3. The method of claim 1, wherein the step of identifying logic paths from the target scan chain comprises the step of identifying logic paths from the target scan chain to at least two observation scan chains.

4. The method of claim 1, wherein the identified logic paths are identified in order of increasing logic path complexity.

5. The method of claim 1, wherein the step of identifying the logic paths from the target scan chain to the at least one observation scan chain until the pre-specified selection criterion is achieved comprises the step of identifying simple logic paths from the target scan chain to the at least one other observation scan chain, wherein simple logic paths are defined as logic paths with no side inputs.

6. The method of claim 5, wherein the step of identifying the logic paths from the target scan chain to the at least one observation scan chain until the pre-specified selection criterion is achieved further comprises the step of identifying complex logic paths from the target scan chain to the at least one observation scan chain, if the pre-specified selection criterion is not achieved with the identified simple logic paths.

7. The method of claim 1, wherein the pre-specified selection criterion is specified in terms of the maximum value of the largest distance in latches between two adjacent target latches in the target scan chain.

8. The method of claim 1, wherein the step of analyzing the contents of the observation latches to determine defect ranges in the target scan chain comprises the steps of:
   measuring the contents of the observation latches; and
   comparing only the contents of the observation latches to expected data.

9. A method for diagnosing failing scan chains, the method comprising the steps of:
   identifying M target latches in a target scan chain, M being a positive integer;
   identifying N logic paths, N being a positive integer,
      wherein each logic path of the N logic paths is electrically coupled to at least a target latch of the M target latches; and
   identifying P observation latches, P being a positive integer,
      wherein each observation latch of the P observation latches is electrically coupled to at least one target latch of the M target latches via at least one logic path of the N logic paths, and
      wherein a content of each observation latch of the P observation latches is a function of contents of target latches of the M target latches which the each observation latch is electrically coupled to.

10. The method of claim 9, further comprising the step of running test patterns against the target scan chain.

11. The method of claim 10, further comprising the step of activating the N logic paths so as to capture contents of the M target latches in the target scan chain into the P observation latches.

12. The method of claim 11, further comprising the step of analyzing contents of the P observation latches to determine defect ranges in the target scan chain.

13. The method of claim 9, wherein two observation latches of the P observation latches reside on two different scan chains.

14. The method of claim 9, further comprising the steps of:
   adding Q target latches into the target scan chain, Q being a positive integer; and
   for each target latch of the Q target latches, adding a logic path connecting the each target latch to an observation latch of an observation scan chain which is different from the target scan chain.

15. The method of claim 9, further comprising the steps of:
   determining a correspondence between (i) states of the M target latches and (ii) expected states of the P observation latches; and
   constructing the correspondence into a lookup table.

* * * * *